(12) United States Patent
Fender et al.

(10) Patent No.: US 7,005,846 B2
(45) Date of Patent: Feb. 28, 2006

(54) SYSTEM AND METHOD FOR APPLICATION CONTROL IN MEASUREMENT DEVICES

(75) Inventors: Michael R. Fender, Colorado Springs, CO (US); Gerald R Kinsley, Colorado Springs, CO (US); Helen K. Muterspaugh, Colorado Springs, CO (US)

(73) Assignee: Agilent Technologies, Inc., Palo Alto, CA (US)

(*) Notice: Subject to any disclaimer, the term of this patent is extended or adjusted under 35 U.S.C. 154(b) by 129 days.

(21) Appl. No.: 10/196,913

(22) Filed: Jul. 17, 2002

(65) Prior Publication Data

US 2004/0012382 A1    Jan. 22, 2004

(51) Int. Cl.
G01R 13/20 (2006.01)
G01R 13/02 (2006.01)

(52) U.S. Cl. .................... 324/121 R; 702/68
(58) Field of Classification Search ............ 324/121 R, 324/76.19, 88, 76.22, 394, 697; 702/68, 702/120; 345/650, 661, 676, 762, 771, 747, 345/866

See application file for complete search history.

(56) References Cited

U.S. PATENT DOCUMENTS

| | | | | |
|---|---|---|---|---|
| 5,564,003 A | * | 10/1996 | Bell et al. ................. 345/747 |
| 5,572,684 A | * | 11/1996 | Canik et al. ............... 710/106 |
| 5,920,316 A | * | 7/1999 | Oran et al. ................ 715/779 |
| 5,930,514 A | * | 7/1999 | Thompson et al. ......... 717/170 |
| 5,939,877 A | | 8/1999 | Alexander |
| 5,953,009 A | | 9/1999 | Alexander |
| 6,049,325 A | * | 4/2000 | Alexander .................. 345/157 |
| 6,098,028 A | * | 8/2000 | Zwan et al. ................ 702/120 |
| 6,201,539 B1 | * | 3/2001 | Miller et al. ............... 345/866 |
| 6,201,540 B1 | * | 3/2001 | Gallup et al. .............. 715/764 |
| 6,385,550 B1 | * | 5/2002 | Jansen et al. ................ 702/91 |
| 6,405,362 B1 | * | 6/2002 | Shih et al. .................. 717/174 |
| 6,421,777 B1 | * | 7/2002 | Pierre-Louis et al. ........ 713/2 |
| 6,631,333 B1 | * | 10/2003 | Lewis et al. ................. 702/24 |
| 6,648,506 B1 | * | 11/2003 | McGrath et al. ........... 374/161 |
| 6,697,754 B1 | * | 2/2004 | Alexander .................. 702/119 |
| 6,771,290 B1 | * | 8/2004 | Hoyle ......................... 345/745 |
| 2002/0026491 A1 | * | 2/2002 | Mason et al. ............... 709/207 |
| 2002/0026646 A1 | * | 2/2002 | Hoang ........................ 725/134 |
| 2002/0129129 A1 | * | 9/2002 | Bloch et al. ................ 709/220 |
| 2002/0131404 A1 | * | 9/2002 | Mehta et al. ............... 370/352 |
| 2003/0005174 A1 | * | 1/2003 | Coffman et al. ............ 709/318 |
| 2003/0035006 A1 | * | 2/2003 | Kodosky et al. ............ 345/763 |
| 2003/0036876 A1 | * | 2/2003 | Fuller et al. ................ 702/127 |
| 2003/0084436 A1 | * | 5/2003 | Berger et al. ............... 717/174 |

* cited by examiner

*Primary Examiner*—Anjan Deb
*Assistant Examiner*—Hoai-An D. Nguyen (57) ABSTRACT

A system and method for application control in measurement devices is disclosed. The method includes installing a new application using the device's graphical user interface, extending the device's menu system for the new application, launching the new application using the device's extended menu system, and controlling the device using the new application through a remote control mechanism of the device. A system of application control in a measurement device is also disclosed.

18 Claims, 11 Drawing Sheets

```
EXTENSION_ENTRY  ->  ITEM_TYPE  ENTRY_DATA  EXECUTABLE_ENTRY;

ITEM_TYPE  ->  "ITEM_MENU"              |
                    "ITEM_TOOLBAR_BUTTON"    |
                    "ITEM_MEASUREMENT"       |
                    (etc.)

ENTRY_DATA  ->  menu_path_string  POSITION_ENTRY  SEPARATOR_ENTRY

POSITION_ENTRY ->  "pos_number" number     |
                    "pos_before" string     |
                    "pos_after"  string     |

SEPARATOR_ENTRY ->  "sep_none"    |
                    "sep_before"  |
                    "sep_after"   |
                    "sep_both"

EXECUTABLE_ENTRY -> filename [args]  |   "null"
```

FIG. 9

```
ITEM_MENU "MAIN\Analyze\&USB Test..."      pos_number -1 sep_before
    "USB_Test.exe /TestAll";
ITEM_MENU "MAIN\Analyze\&PRML"             pos_number -1 sep_before
    "null";
ITEM_MENU "MAIN\Analyze\PRML\&FIR..."      pos_number  0 sep_none
    "PRML_1.exe";
ITEM_MENU "MAIN\Analyze\PRML\&Viterbi..."  pos_number  1 sep_none
    "PRML_2.exe";
```

FIG. 10

```
#define APP_COMMAND_0   16384
#define APP_COMMAND_1   16385
#define APP_COMMAND_2   16386
...
#define APP_COMMAND_99  16483
```

```
AppArray:

Index     Value
-----     -----
   0      c:\scope\apps\USB_Test /TestAll
   1      c:\scope\apps\PRML_1.exe
   2      c:\scope\apps\PRML_2.exe
   3      null
  ...     null
  99      null
```

FIG. 13

```
void OnAppCommand(int Command)
{
    ExecuteProgram(AppArray[Command - APP_COMMAND_0];
}
```

SYSTEM AND METHOD FOR APPLICATION CONTROL IN MEASUREMENT DEVICES

BACKGROUND

Measurement devices include such items as oscilloscopes, logic analyzers, network analyzers, and spectrum analyzers. Since oscilloscopes are the most prevalent of these devices, the following discussion will focus on the oscilloscope with the understanding that most of the following discussion equally applies to the other measurement devices.

Modern oscilloscopes are powerful general purpose tools for engineers and technicians working in a wide variety of jobs across many industries. While their generality is often an advantage, there are situations where customers desire to extend the functionality of a general purpose oscilloscope into a specific application-focused measurement solution. One example of such a situation is Universal Serial Bus (USB) pre-compliance testing. In order to achieve USB interoperability certification, a new USB device must pass a series of performance tests specified by an industry consortium. Official compliance testing is time consuming and expensive, and device manufacturers prefer to ascertain whether their new product is ready for full compliance testing via an easy pretest operation that they can perform themselves using an oscilloscope. Another example is a disk drive read-channel analysis. In order to achieve higher bit densities on magnetic media, disk manufacturers are turning to PRML (Partial Response Maximum Likelihood) approaches. In these approaches, data is stored such that individual bits intentionally overlap with adjacent bits, creating inter-symbol interference. Rather than reading and interpreting individual bits based on simple threshold detection, the read-channel processes the head signal from a stream of consecutive bits and uses statistical techniques to determine the best binary interpretation of the bit stream. In this application, customers desire to process the basic volts versus time oscilloscope data in a way that is PRML-aware, so they can verify various aspects of the processing chain with respect to the intended signals. Other current examples may include jitter analysis and power signal analysis. Still other applications will emerge in the future.

While it is sometimes feasible to include certain application-specific measurements or functions into the oscilloscope, full solutions are often best accomplished through the use of a separate program to further process the data acquired by the oscilloscope. Such application programs typically require deep knowledge of the target industry and involve complex and/or proprietary measurement algorithms. They may be developed by different individuals and under different schedules than the oscilloscope itself. Applications that are unknown at the time of the oscilloscope development may be created by third parties to capitalize on new market opportunities.

Application programs may be executed on external computers, or on the oscilloscope itself in the case where the oscilloscope is based on an open standard computing platform such as an X86 compatible personal computer (PC).

Prior application approaches using separate programs have been developed for prior systems. However, in these approaches the operation is centered on the application program and not the oscilloscope. The user interacts with the application program, which may reside on a different machine than the oscilloscope, and the application program controls the oscilloscope via a programmatic interface such as general purpose interface bus (GPIB) (EEE 488). This approach captures the benefits of de-coupling the application software from the oscilloscope, but is disadvantageous in that it requires users to change their "home base" from the oscilloscope to the application program. If it involves the use of an external PC, it is even less desirable from the standpoint of delivering a single box, turnkey solution.

There are also existing approaches based on incorporating the entire application into the oscilloscope software. This approach has been practiced extensively by LeCroy Corp. in their jitter analysis and disk drive analysis/verification packages. While it maximizes the integration attribute, this approach presents other difficulties. One of these is that the user interface (UI) to the application must be presented within the basic UI framework of the oscilloscope. For example, if the oscilloscope UI is based on softkeys, the application must fundamentally conform to a softkey paradigm. This may compromise the utility of the application. Another difficulty is that it may not be possible to develop applications independently from the oscilloscope software. Support for a new application generally requires a new revision of the oscilloscope software.

LeCroy Corp. also has a "user-defined" measurement system that allows the user to access a Visual Basic (VB) script window from within the oscilloscope application. The user then types in a VB script for a custom measurement/ math function, closes the VB script window, and then runs the custom measurement function on the oscilloscope.

Another prior art alternative is based on the Component Object Model (COM) system supported by Microsoft Inc. and other software vendors. In this alternative, the oscilloscope software is developed with a COM interface that provides for rich interaction possibilities with applications that may be developed in the future. This alternative provides de-coupling of the application software from the oscilloscope while theoretically allowing for an integrated user interface via menus, dialog boxes and other controls. The main disadvantage of this alternative is its complexity, both in terms of setting up the oscilloscope with a COM interface, and in terms of the work application developers would have to do to connect their applications to the oscilloscope system. Application developers would have to learn about the COM interface and would have to compile their systems using header files that were provided by the oscilloscope manufacturer. The oscilloscope manufacturer would likely have to provide means to support multiple application development languages and tool chains.

SUMMARY

An application control system and method for a measurement device is described. The system and method allows for the running of a new application on the measurement device. This is accomplished by extending the functionality of the measurement device through the new application while retaining the operational feel of an integrated solution.

In one embodiment, the system includes a measurement device comprising a graphical user interface adapted to install new applications and adapted to extend for the installation of one of the new applications by adding at least one user interface entry for the one of the new applications to the graphical user interface, and an operating system adapted to launch the one of the new applications using the added user interface entry.

In another embodiment, the method includes installing a new application using a graphical user interface of the device, extending the graphical user interface, launching the new application using the extended graphical user interface, and controlling the device using the new application.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

Various aspects of the invention will now be described with reference to the following figures ("FIGs.") which are not necessarily drawn to scale, but use the same reference numerals to designate corresponding parts throughout each of the several views.

DETAILED DESCRIPTION

The present invention is a system and method for application control in a measurement device that may be implemented in any computer-based measurement device. In one preferred embodiment of the present invention, the application control system is implemented in a measurement device, such as a digital or analog oscilloscope, logic analyzer, network analyzer, or spectrum analyzer, etc. The following description will describe the embodiment for a digital oscilloscope, however, the system and method of the present invention could be utilized in any of the above mentioned measurement devices or any other computer-based measurement device.

Figure 1:
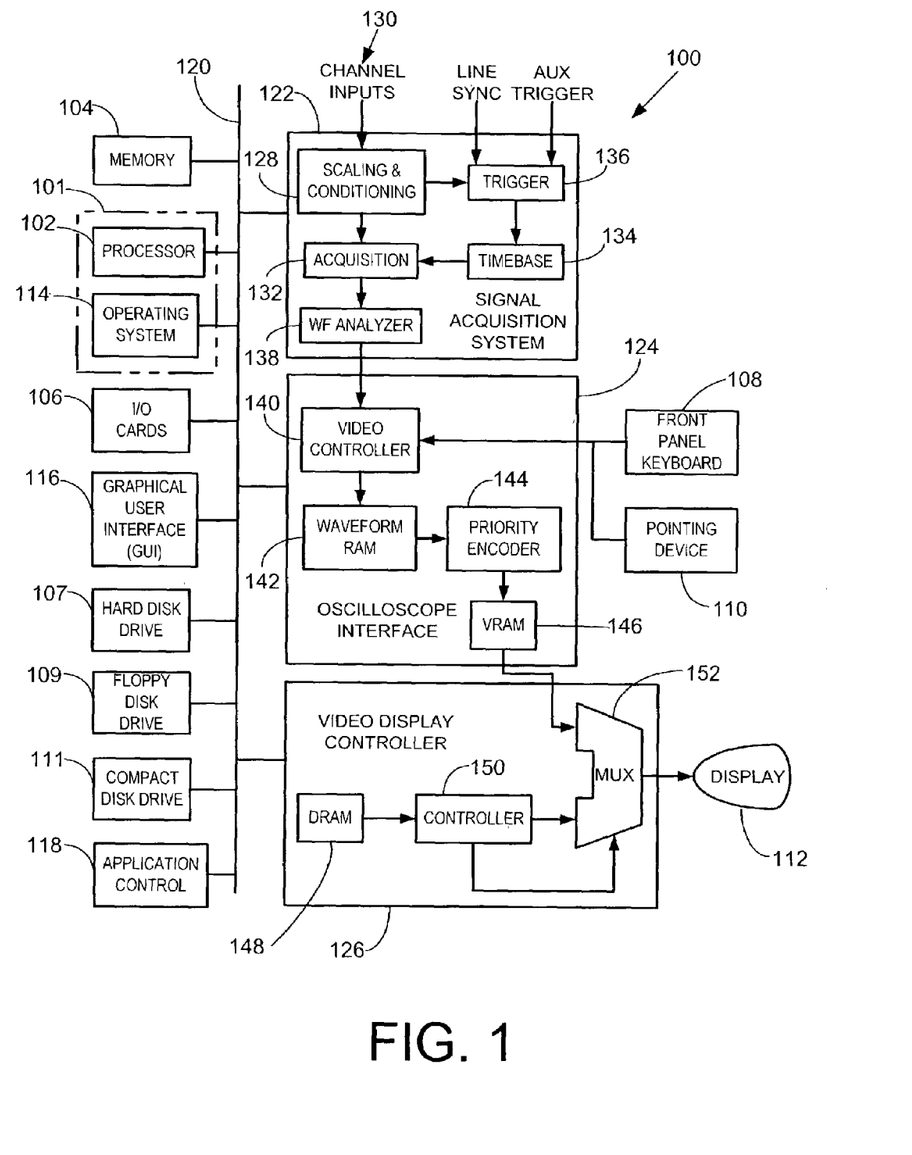
FIG. 1 is a functional block diagram of a digital oscilloscope suitable for implementing the system and method of the present invention.

FIG. 1 is a functional block diagram of an exemplary digital oscilloscope suitable for implementing the application control system and method of the present invention. The present invention is built on the basic system design whereby applications are implemented as separate programs from the main oscilloscope program.

A PC-based oscilloscope, such as an Agilent Infiniium product, is used so that the application programs may be executed on the same machine as the oscilloscope program. To the basic framework of the PC-based oscilloscope, the following elements are added: 1) the ability to install new applications from the oscilloscope's user interface; 2) the ability to extend the oscilloscope's menu system when a new application is installed; 3) the ability to launch (invoke) applications using the augmented elements of the oscilloscope's menu system; and 4) the ability for the application to control the oscilloscope using an existing, well-understood interface.

These added elements are designed so that applications may be developed and installed without having to revise the oscilloscope software, an important advantage of the present invention. This is possible because each element essentially describes an interface (a consistent, agreed upon system for interaction) that helps implement the associated functionality.

The digital oscilloscope 100 includes commonly-available digital oscilloscope functionality designed to acquire, analyze and display a wide variety of signals, generally in terms of the voltage of the signals versus time. The digital oscilloscope 100 preferably includes a general purpose computer system, which is programmable using a high level computer programming language, and specially programmed, special purpose hardware for performing signal acquisition, analysis and display functions.

The digital oscilloscope 100 includes a processor 102, a memory unit 104, input/output (I/O) interface cards 106, storage units such as a hard disk drive 107, a floppy disk drive 109, and a compact disk (CD) drive 111, one or more input devices such as front keyboard panel 108 and pointing devices 110 and display 112. The memory 104 is used for storage of program instructions and for storage of results of calculations performed by the processor 102. In a preferred embodiment, the memory 104 includes random access memory (RAM). The display 112 is preferably a liquid crystal display and is logically or physically divided into an array of picture elements (pixels). The input/output (I/O) interface cards 106 may be modem cards, network interface cards, sound cards, general purpose interface bus (GPIB) interface cards, universal serial bus (USB) interface cards, RS-232 interface cards, etc.

The processor 102 is typically a commercially available processor, such as the Pentium microprocessor from Intel Corporation, PowerPC microprocessor, SPARC processor, PA-RISC processor or 68000 series microprocessor. Many other processors are also available. Such a processor usually executes a program referred to as an operating system 114, such as the various versions of the Windows operating systems from Microsoft Corporation, the NetWare operating system available from Novell, Inc., or the Unix operating system available from many vendors such as Sun Microsystems, Inc., The Hewlett-Packard Company and AT&T. The operating system 114 controls the execution of other computer programs, such as a graphical user interface (GUI) 116 and application control system 118, and provides scheduling, input-output control, file and data management, memory management, and communication control and related services. The processor 102 and operating system 114 define a computer system shown by dashed block 101, for which application programs in high level programming languages are written. The functional elements of the digital oscilloscope 100 communicate with each other via bus 120.

The digital oscilloscope 100 includes a signal acquisition system 122, a oscilloscope interface card 124 and video display controller 126. The signal acquisition system 122 includes scaling and conditioning unit 128 that receives input signals through channel inputs 130. The scaling and conditioning unit 128 and acquisition unit 132 include well-known high frequency electronics for signal acquisition, signal conditioning, and analog-to-digital conversion, all of which are controlled by the computer system 101 and are considered to be well-known in the art. A timebase 134 drives the analog-to-digital conversion process performed in acquisition unit 132, specifying input sampling timing and frequency. A trigger 136 synchronizes the acquisition process through the timebase 134, enabling the user to arrange a trigger event to obtain a stable waveform display of the desired features of one or more of the input signals. Trigger 136 may be based upon a line synchronization or auxiliary trigger input, as is well known in the art.

A waveform analyzer 138 performs measurement processes for developing the waveform for display. The waveform analyzer 138 contains hardware and software to perform well-known operations such as setting the analog-to-digital codes for the acquisition unit 132 and mapping the resulting digital information to the physical pixel locations, which are ultimately presented on display 112 under the control of GUI 116. The pointing device 110 and/or the keyboard 108 are used to move a cursor on the GUI-controlled display 112 to select display elements under the cursor. The pointing device 110 may include any number of pointing devices such as a mouse, trackball or joystick. Of course, the cursor may be controlled with one or more keyboards 108 located externally or integrated into a front panel of the digital oscilloscope 100.

The oscilloscope interface card 124 includes a video controller 140 that controls the rendering of pixels into the waveform random access memory (RAM) 142. The oscilloscope interface card 124 also receives display element control commands and cursor input information from the front panel keyboard 108 and the pointing device(s) 110. The waveform RAM 142 includes a data structure for each pixel location on the display 112. The data structures contain information regarding every display element that is to be drawn at each pixel location. Although there may be multiple display elements which are to be drawn at a given pixel location, only one color may be rendered at that location. A waveform RAM 142 supplies a priority encoder 144 with this information.

The priority encoder 144 prioritizes the competing display elements. For example, if the user arranged a marker and a waveform such that they are located in the same pixel location, then the priority encoder 144 selects that display element with a highest predetermined priority. In such an example, the color of the marker is rendered at the pixel location providing a display that appears to show the marker over the waveform. The priority encoder then sends the selected color to the VRAM 146, which then causes the pixel to be rendered in the indicated color.

The video display controller 126 includes a dynamic random access memory (DRAM) 148 which contains data specifying a color for each pixel in the display 112. Likewise, a video random access memory (VRAM) 146 also contains data specifying a color for each pixel in the display 112. The computer system 101 controls the information in DRAM 148 while the signal acquisition system 122 controls information in the VRAM 146. For each pixel in the display 112, the video controller 126 selects whether the pixel in the display 112 is specified from VRAM 146 or DRAM 148. In general, information in VRAM 146 includes digitized waveforms being generated by the signal acquisition system 122 with high rates of change that are typically too fast for software processing by the computer system 101 to provide a real-time display of the waveform on display 112.

Video display controller 126 includes a controller 150 and a multiplexer 152. Controller 150 controls which of the two inputs to the multiplexer 152 are processed into display signals for transmission to the display 112 under the control of the graphical user interface 116. The controller 150 typically monitors color data sent from the DRAM 148 and may be programmed to switch the multiplexer 152 to a different input when a particular programmed color is received from the DRAM 148. A rectangular pixel area is typically defined within DRAM 148 with the programmed color, typically dark gray. The programmed color is not displayed, but instead serves as a data path switch control for the multiplexer 152. Therefore, within the programmed color rectangle, display data comes from VRAM 146. When various control functions are needed, an interactive dialog box is drawn within the programmed color rectangle by the controller 150.

Figure 2:
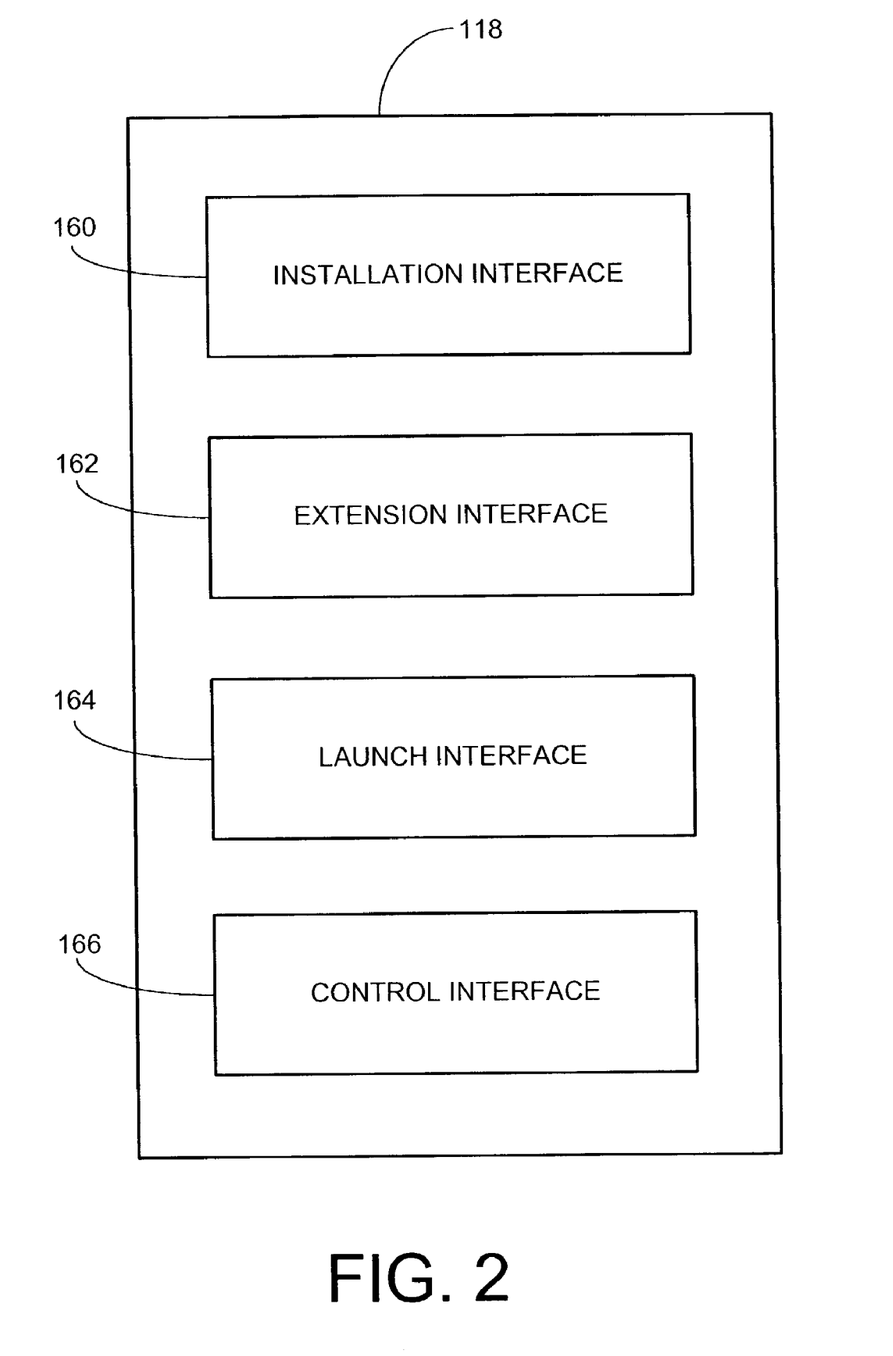
FIG. 2 is a functional block diagram of the application control block of FIG. 1.

FIG. 2 shows a block diagram of the application control system 118. The application control system includes an installation interface 160, an extension interface 162, a launch interface 164, and control interface 166. The application control system implements methods for installing a new application, extending the oscilloscope's menu system, launching the new application with the extended menu system, and controlling the oscilloscope with the new application.

The software routines for performing the application control methodology in accordance with the invention typically reside in memory 104 (FIG. 1) and/or hard disk drive 107 (FIG. 1).

Preferably, the application control system 118 is implemented in any well-known programming language such as C or C++. Those having ordinary skill in the art will appreciate that different implementations, including different function names, programming languages, data structures, and/or algorithms may also be used in embodiments of the present invention other than those described below. It should be further understood that the invention is not limited to a particular computer platform, particular operating system, particular processor, or particular high level programming language, and that the hardware components identified above are given by way of example only. The application control system may be implemented, for example, in dedicated hardware, firmware, or any combination thereof.

FIGS. 3–8 are illustrations of windows rendered by the graphical user interface 116. In each illustrated display, a menu 174 and waveforms 176, 178 are displayed within a window 172. A perimeter area 170 of window 172 is defined within the DRAM 148 by a Windows operating system running on computer system 101.

Figure 3:
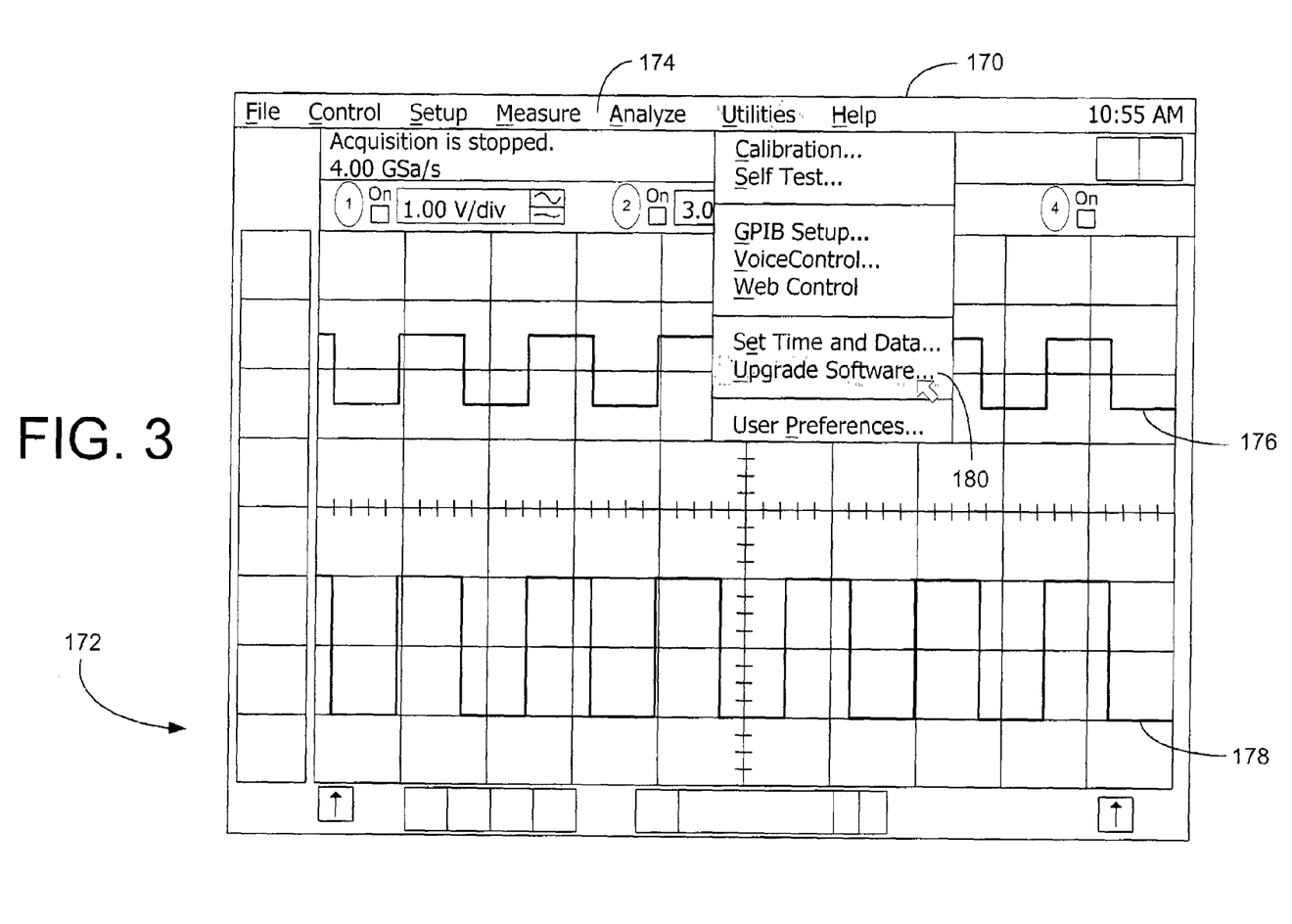
FIG. 3 is an illustration of a graphical user interface having a menu item for upgrading the software.
Figure 4:
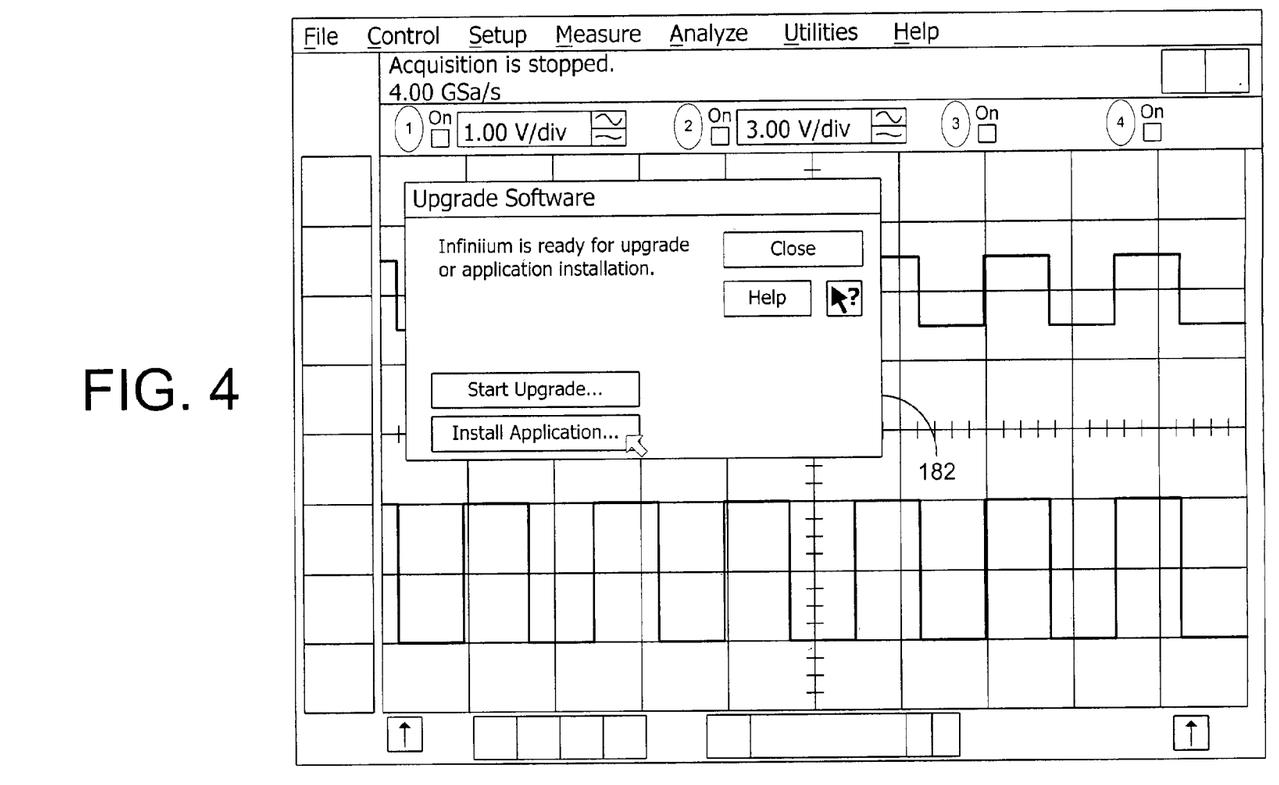
FIG. 4 is an illustration of the graphical user interface of FIG. 3 showing the upgrade software window.
Figure 5:
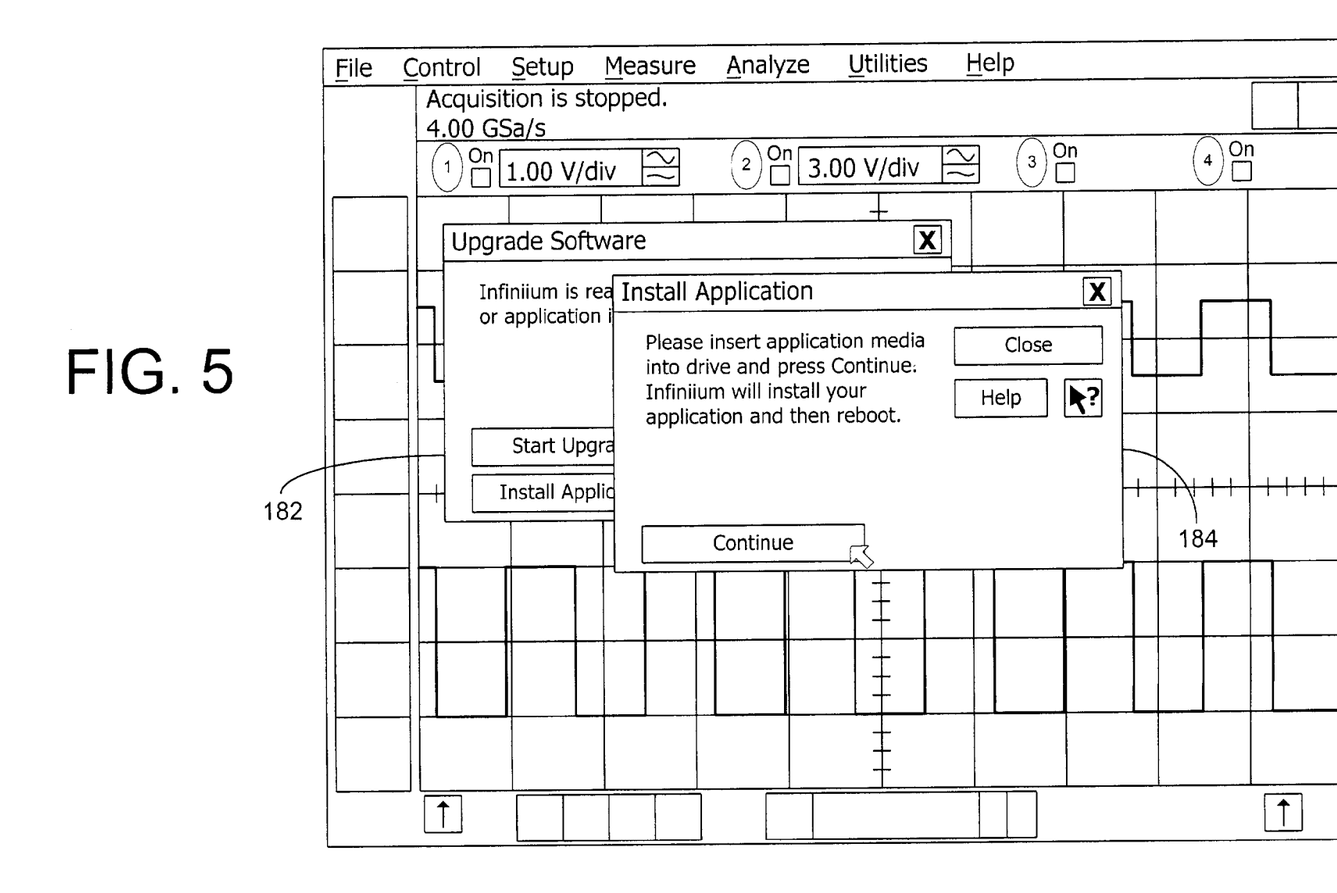
FIG. 5 is an illustration of the graphical user interface of FIG. 4 showing the install application window.

FIGS. 3–5 show the windows used by the installation interface 160. The installation interface 160 includes a menu item 180 and a pair of dialog boxes 182, 184 that are implemented in the oscilloscope's operating system 114. The menu item 180 (FIG. 3) launches the dialog box 182 (FIG. 4) from which the user is asked whether they are upgrading the software or installing an application. Upon selecting the installation of an application in the dialog box 182, the dialog box 184 is launched, from which the user is instructed to insert the media containing the application software. The oscilloscope then runs a batch file that terminates the operation of the oscilloscope, runs the application's installation program, and then reboots the oscilloscope. Terminating the operation of the oscilloscope and rebooting are required in order to accommodate applications that must install new copies of system dynamic link libraries (DLLs). Upon rebooting, the oscilloscope operating system 114 is re-launched.

The new application may be stored on a computer-readable medium such as, for example, a magnetic disk, a compact disc or magnetic tape and may be loaded into the digital oscilloscope 100 using an appropriate peripheral device as known to those having ordinary skill in the art, such as floppy disk drive 109 or compact disk drive 111.

The extension interface 162 (FIG. 2) is used to augment the GUI 116 of the oscilloscope to incorporate the function of accessing the added application feature(s). The extension interface 162 is based on a declarative methodology where each application inserts textual information into a special file, referred to as an "AppAccess.dat" file, as part of its installation process. This file is read by the oscilloscope and used to create additional user interface entries from which an application can be launched and potentially controlled. The augmentation to the oscilloscope GUI could take many forms. For example, a new menu item, a new toolbar button, a new measurement selection, etc., could be specified in the AppAccess.dat file. The extension data in this file is in text format to facilitate clarity and allow users or third parties to manually edit the files as part of the application development process.

The following discussion of the extension interface grammar will concentrate on a specific example of adding new menu entries for a USB Test application and a PRML application. However, the extension interface is in no way limited to menu entries. The EXTENSION_ENTRY (FIG. 9) first specifies the type of object being added. The added object could be a menu item (as it is in this example), a toolbar button, or any other object that could appear in the oscilloscope GUI.

The data format found in the AppAccess.dat file is such that menu items may be added anywhere in the oscilloscope's menu hierarchy, and each menu item may be associated with either a submenu or an application program that is to be invoked when the menu item is selected. The complete data methodology may be viewed as grammar that is described in Backus Naur Form (BNF) notation in FIG. 9. In BNF notation, non-terminals (items which are defined in terms of other non-terminals and terminals) are indicated as uppercase symbols, terminals (items which require no further definition) are indicated as lowercase symbols, and literals (literal words themselves) are indicated in quotes.

Figure 9:
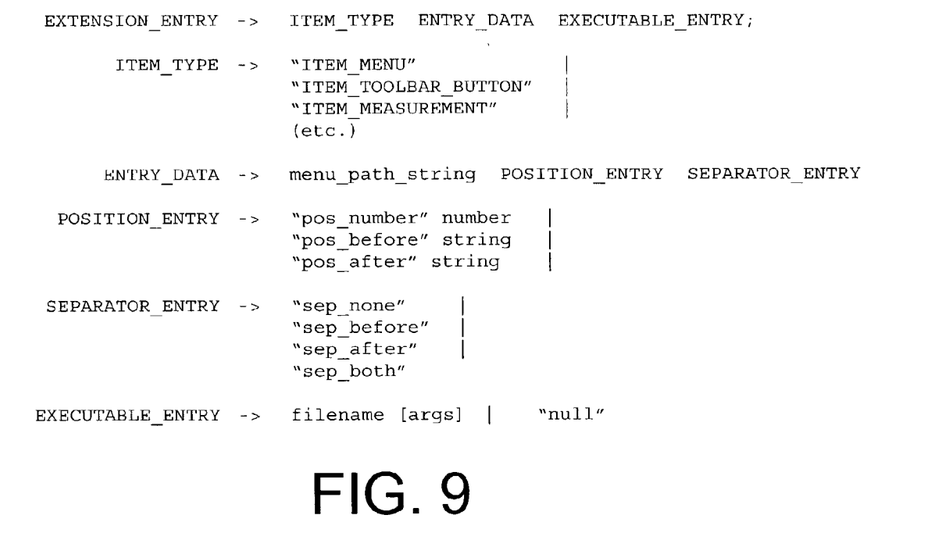
FIG. 9 is an example of an AppAccess.dat file with the data scheme in BNF notation.

Special meanings for the data scheme of FIG. 9 include the following:

Setting number to −1 specifies the last position in the menu.

Setting EXECUTABLE_ENTRY to null specifies a popup (subordinate) menu.

Executable files are assumed to reside in the c:\scope\apps directory.

Alternatively, fully-qualified path names may be given.

The ITEM_TYPE lists some of the possible extension that could be specified. In this example the ITEM_TYPE would be the literal "ITEM_MENU." Different item types would dictate different data in the ENTRY_DATA field appropriate to the desired item. Also, while illustrated using the above BNF description, the extension grammar may in fact be structured differently. For example, the grammar could be arranged so that the major non-terminals forming the right hand side of the EXTENSION_ENTRY rule could occur in any order.

The menu_path_string terminal is a string which specifies both the new item and the location in the existing oscilloscope menu hierarchy at which the new item is to be added. For example, the text "MAIN\Analyze\&USB Test" instructs the processor to insert a new menu item called "USB Test" in the existing "Analyze" submenu. The MAIN designation indicates the main oscilloscope menu; this allows the system to account for cases where multiple menus may be used in the oscilloscope. The ampersand (&) symbol in the string indicates a shortcut key request to the oscilloscope as to which character in the new menu item should be underscored as part of implementing and communicating the keyboard shortcut for the menu item. Shortcut characters must be unique within a submenu, so the request may be overridden by the oscilloscope if it conflicts with an existing shortcut within the submenu. Omitting a shortcut key request is acceptable; in such cases the oscilloscope will select a shortcut key automatically. If the leading elements of menu_path_string do not match the actual oscilloscope menu, the new item will be installed at a default location, for example at the bottom of the "Analyze" menu.

Figure 6:
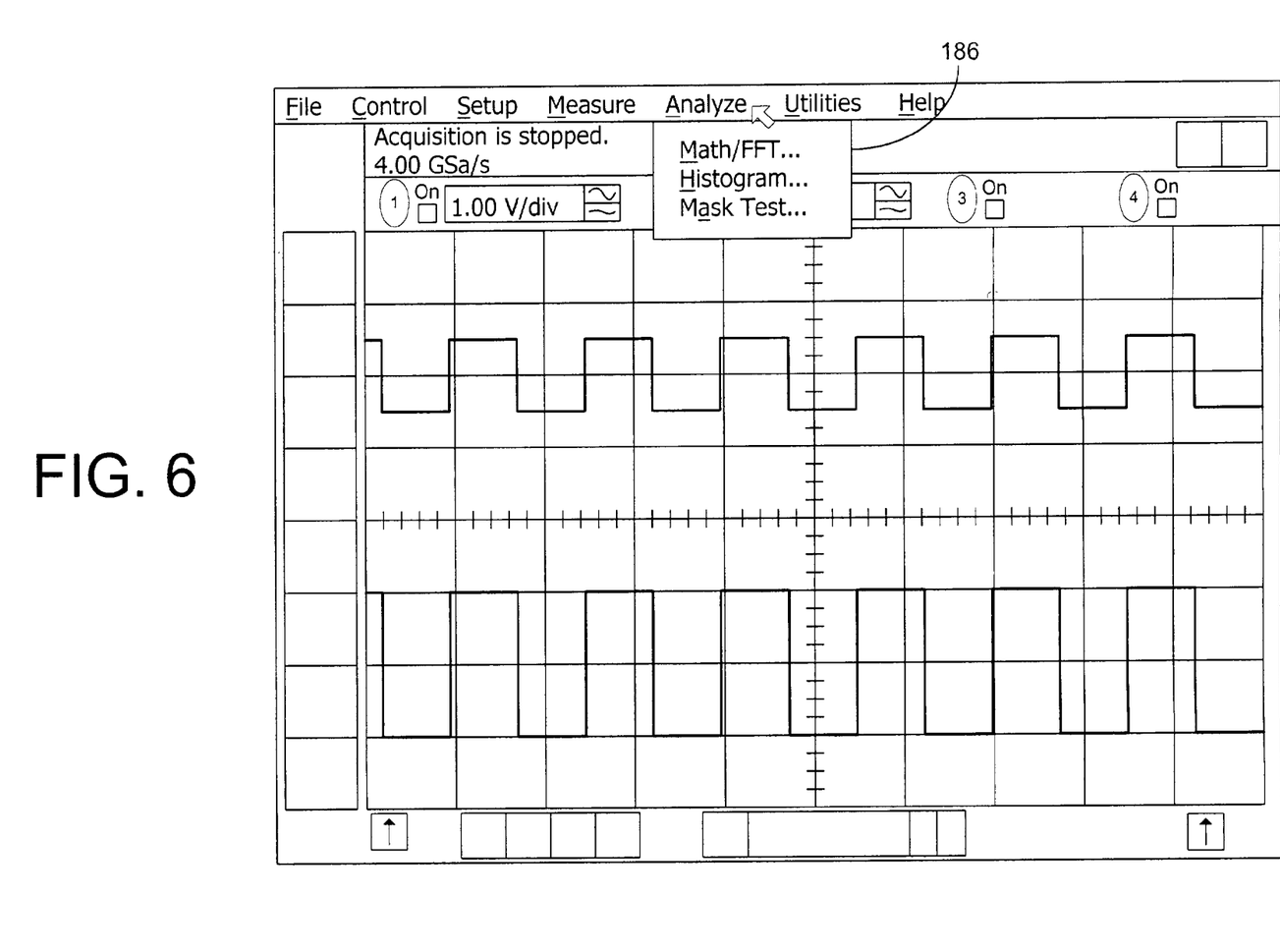
FIG. 6 is an illustration of a graphical user interface showing the analyze menu prior to the loading of the new applications.
Figure 7:
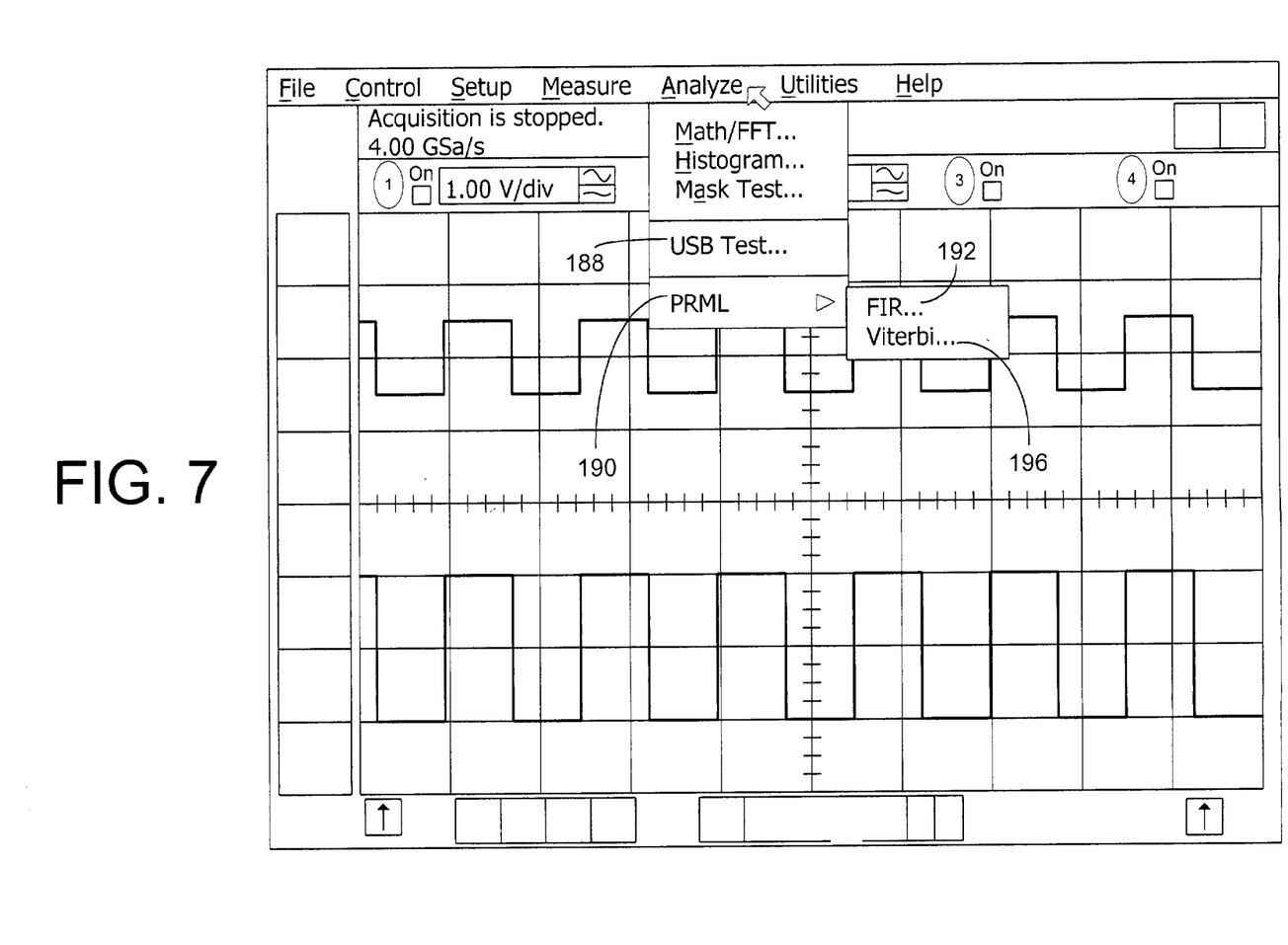
FIG. 7 is an illustration of the graphical user interface of FIG. 6 showing the analyze menu after the loading of the new applications.
Figure 10:
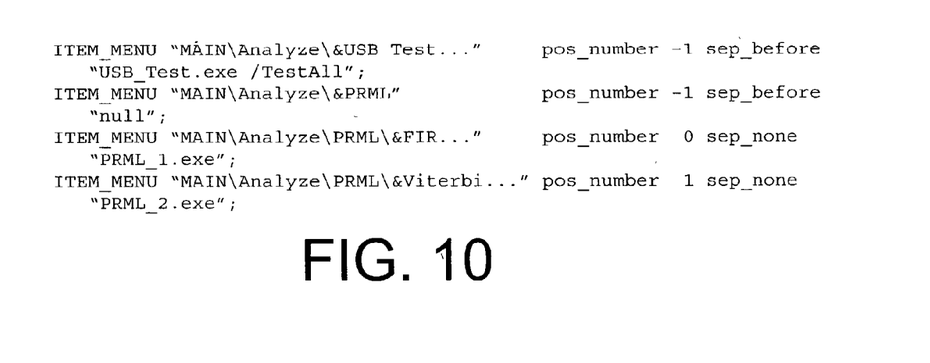
FIG. 10 is an example of a section of the AppAccess.dat file after a pair of applications have been installed.

FIG. 10 shows a more complete example of a section of the AppAccess.dat file after the USB Test and PRML applications have been installed. Each extension line is terminated by a ';' character. Assuming the basic oscilloscope menu structure is as shown in FIG. 6 having menu list 186, the AppAccess.dat file of FIG. 10 leads to the augmented menu structure shown in FIG. 7, which includes new menu items 188, 190 and sub-items 192, 194.

Figure 11:
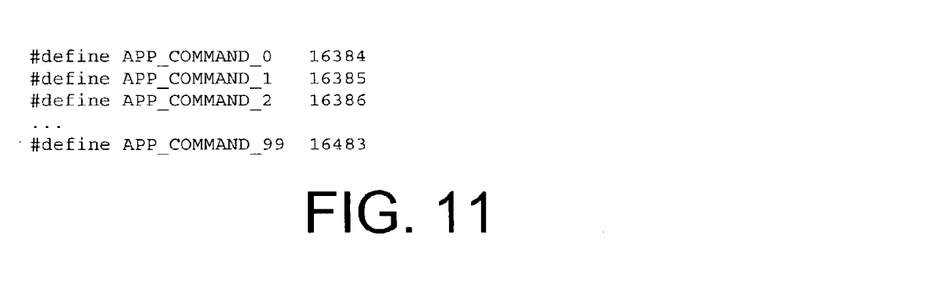
FIG. 11 is an example of a block of unique command identifiers.

The launch interface 164 (FIG. 2) is implemented within the oscilloscope operating system 114 using data structures provided by the Microsoft Visual C++ software development environment. A similar interface could be implemented using a different programming language, whereby the exact nature of the implementation is not critical to the present invention. The C++ implementation is described here for completeness. First, a block of unique command identifiers is reserved. Each identifier is a symbol with an associated numeric value. The numeric values constitute a contiguous series. For example, the identifiers may be set up as shown in FIG. 11.

Figure 12:
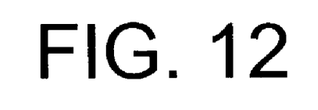
FIG. 12 is an example of a message map entry.

Next, a message map entry is created as shown in FIG. 12. This causes any commands that are generated as a result of a user interface selection (a menu selection, toolbar selection, etc.) associated with identifiers in the given range to be routed to the same handler function, OnAppCommand.

Figure 13:
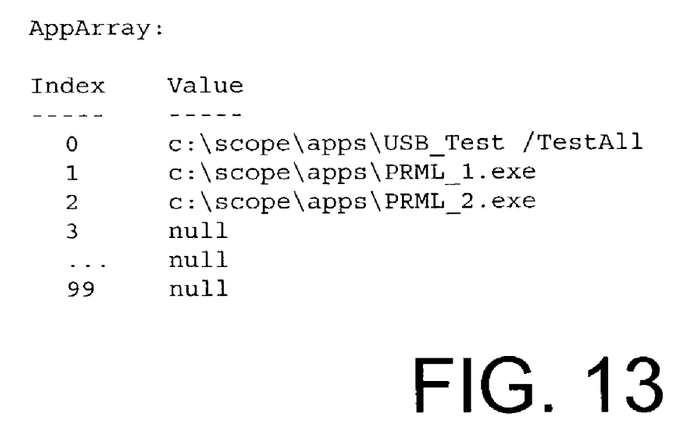
FIG. 13 is an example of a string array reserved for the additional applications.

Finally, space for an array of strings is reserved. Each string represents the executable filename (including any arguments) that is to be associated with a given application selection. At run time, when the oscilloscope reads the AppAccess.dat file, the oscilloscope associates the next available command identifier with each successive new extension entry, and the oscilloscope stores the executable filename in the next available position in the string array. For the example given above, the string array would appear as shown in FIG. 13.

Figure 14:
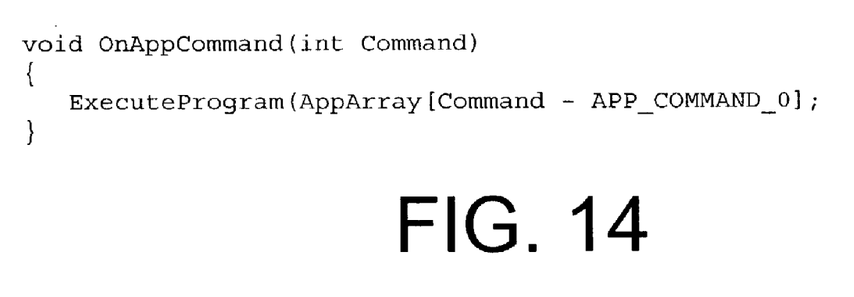
FIG. 14 is an example of a handler function used to execute the correction program when a given application menu item is selected.

The handler function uses this array to execute the correct program when a given application menu item is selected by the user as shown in FIG. 14. The value of the initial identifier in the range is subtracted from the actual command value in order to index into the array correctly beginning a position 0.

The launch interface 164 supports the de-coupling of application development from the oscilloscope development because the launch interface requires no advance knowledge of the exact applications that may be developed.

The control interface 166 (FIG. 2) leverages an existing remote control mechanism by which external programs may control nearly all aspects of the oscilloscope's functionality. The remote control mechanism, included in the I/O card 106 (FIG. 1) may be a general purpose interface bus (GPIB) interface, a universal serial bus (USB) interface, an RS-232 interface, or other suitable interface.

For this discussion, a GPIB interface will be used. The GPIB interface allows IEEE 488 commands to be issued to the oscilloscope over a local area network (LAN) physical interface. When external programs make use of this capability, they must specify the LAN address of the oscilloscope in order to uniquely identify the recipient device on the network. An internal program (programs running on the same machine as the oscilloscope) specifies the special LAN identifier "localhost." This allows the application to communicate with the oscilloscope directly. This invention makes use of this latter capability because it is based on application programs running on the oscilloscope. IEEE 488 commands are a convenient mechanism for an application to control the oscilloscope, because IEEE 488 programming is well understood by many engineers who may be involved in developing oscilloscope applications. Using these commands for applications is also convenient for oscilloscope manufacturers because it lets them avoid developing a separate interface solely to support applications.

Figure 8:
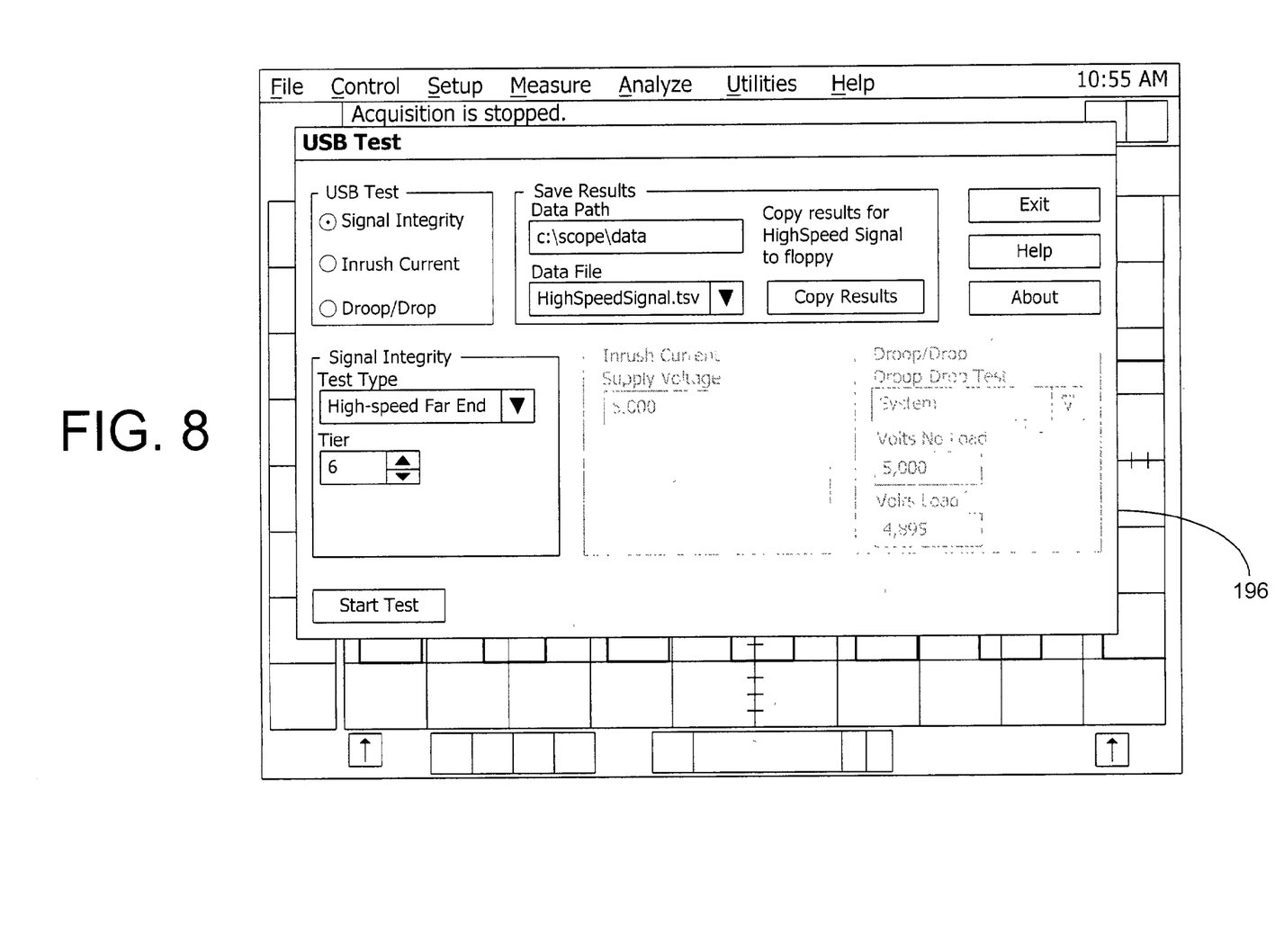
FIG. 8 is an illustration of the graphical user interface of FIG. 7 showing the USB test window.

FIG. 8 shows the execution of an exemplary application pertaining to USB testing with USB Test window 196. While the USB Test window 196 appears to be a dialog box, it is actually a separate application. In many cases the application window will be maximized, appearing entirely on top of the oscilloscope window area 170.

Figure 15:
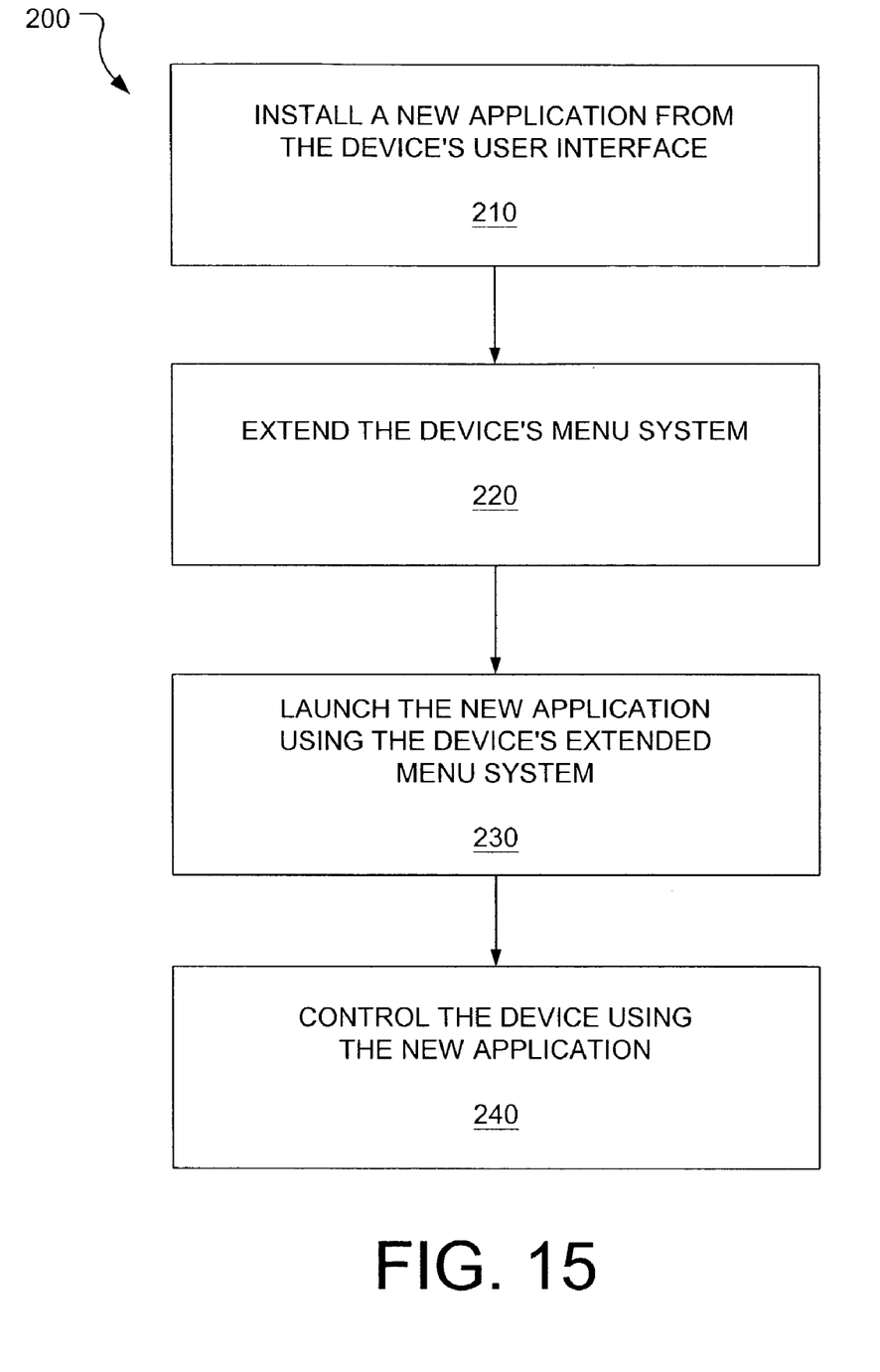
FIG. 15 is a flowchart for an embodiment of an application control method.

FIG. 15 shows the architecture, functionality, and operation of an application control method 200 that may be implemented with the oscilloscope shown in FIG. 1 and/or other measurement devices. Each block in FIG. 15 represents an activity, step, module, segment, or portion of computer code that will typically comprise one or more executable instructions for implementing the specified logical function(s). However, a variety of other of computer, electrical, electronic, mechanical, and/or manual systems may also be similarly configured to operate in a similar manner. It should also be noted that, in various alternative implementations, the functions noted in the blocks will occur in an order different than noted in figures. For example, multiple functions in different blocks may be executed substantially concurrently, in a different order, incompletely, and/or over an extended period of time, depending upon the functionality involved. Various steps may also be completed manually.

The application control method 200 begins with the installation of a new application using the device's graphical user interface at step 210. At step 220, the device's menu system is extended to incorporate at least one user interface entry for the new application. After the device's menu system has been extended, the new application may be launched using the device's extended menu system in step 230. At step 240, the new application controls the device through a remote control mechanism.

As noted above the application control method 200 shown in FIG. 15 is implemented in software. The application control method 200 may be part of a source program (or "source code"), executable program ("object code"), script, or any other entity comprising a set of instructions to be performed as described in more detail below. Such software may be written using an object oriented programming language having classes of data and methods, and/or a procedure programming language, having routines, subroutines, and/or functions. For example, suitable programming languages include, but are not limited to, C, C++, Pascal, Basic, Fortran, Cobol, Perl, Java, and Ada.

Such software may be stored on any computer readable medium for use by, or in connection with, any computer-related system or method. For example, the computer readable medium may include any electronic, magnetic, optical, or other physical device or means that can contain or store a computer program for use by, or in connection with, a computer-related system or method. The computer-related system may be any instruction execution system, apparatus, or device, such as a computer-based system, processor-containing system, or other system that can fetch the instructions from the instruction execution system, apparatus, or device and then execute those instructions. Computer-readable medium therefore includes any means that will store, communicate, propagate, or transport the program for use by, or in connection with, the instruction execution system, apparatus, or device.

For example, the computer readable medium may take a variety of forms including, but is not limited to, an electronic, magnetic, optical, electromagnetic, infrared, or semiconductor system, apparatus, device, or propagation medium. More specific examples of a computer-readable medium include, but are not limited to, an electrical connection (electronic) having one or more wires, a portable computer diskette (magnetic), a random access memory ("RAM") (electronic), a read-only memory ("ROM") (electronic), an erasable programmable read-only memory ("EPROM," "EEPROM," or Flash memory) (electronic), an optical fiber (optical), and a portable compact disc read-only memory ("CDROM") (optical). The computer readable medium could even be paper or another suitable medium upon which the program is printed, as the program can be electronically captured, for instance via optical sensing or scanning of the paper, and then compiled, interpreted or otherwise processed in a suitable manner before being stored in a memory.

In a typical embodiment, once the software implementation of the application control method shown in FIG. 15 is accessed, a processor will typically be configured to execute instructions corresponding to the method 200 in conjunction with an operating system stored within a memory. The processor will also receive and execute further instructions and data stored in memory or made available from various input/output devices (such as the source and/or detector assemblies discussed above) so as to generally operate the system pursuant to the instructions and data contained in the software.

The invention has several advantages over previous approaches. Unlike approaches centered around standalone applications programs that may run on a separate computer, the present invention solution is center around the oscilloscope. The user installs and invokes the application program from the oscilloscope, which is his or her natural and preferred device for interaction. The application runs on the same computer as the oscilloscope and the connectivity between the application and the oscilloscope is intrinsic, delivering a seamless control interface. Because the oscilloscope launches the application and the application then controls the oscilloscope, the two programs constitute a cooperating system that the user perceives as an integrated solution. Running all the applications from the oscilloscope is an advantage with respect to ease of use.

It is envisioned that the installation implementation described above using the GUI could be replaced with a method of installation with little or no operator interface with the GUI. For example, a bootable disk that installs the application and necessary GUI/configuration files/data could be utilized. In this case, the installation GUI may prompt the user to reboot the oscilloscope or merely inform the user that the oscilloscope will be automatically rebooted to complete the installation.

It is also envisioned that during the extension of the oscilloscope a new ".dat" file could be specified by the new application and be loaded by the oscilloscope program. This could be implemented by having the oscilloscope application boot up and search a specific directory (for example, C:\scope\app_extension_data) for all ".dat" files, and then loading each one in turn. This method has the additional desirable attribute of isolating data about a specific extension application to a specific file. This method may also simplify installation of other tools/applications as the GUI extension-file (the ".dat" file) merely needs to be copied into the appropriate directory. Basically, the GUI-extension data could show up in a single ".dat" file or in multiple ".dat" files.

Unlike approaches based on incorporating the entire application functionality into the oscilloscope itself, the present invention allows applications to be developed independently of the oscilloscope software, and it allows applications flexibility in the ways they use for interacting with the user. Unlike alternatives based on the COM architecture, the present invention is simpler and more accessible to a wider range of application developers. The system overhead required by the present invention and knowledge required to make effective use of it is minimal.

It should be emphasized that the embodiments described above, and particularly any "preferred" embodiments, are merely examples of various implementations that have been set forth here to provide a clear understanding of various aspects of the invention. One of ordinary skill will be able to alter many of these embodiments without substantially departing from scope of protection defined solely by the proper construction of the following claims.

The invention claimed is:

1. A measurement device adapted to acquire and process data from an external device and display a representation of the data, said measurement device comprising:
   a graphical user interface logic adapted to display the representation of the data on a graphical user interface;
   application control logic adapted to receive text information from an application into a user-editable text file and adapted to extend functionality of the measurement device by augmenting the functionality of the graphical user interface with the text information, wherein the text information specifies an object to be displayed on the graphical user interface and an insertion location of the object in the graphical user interface;
   a remote control mechanism to allow the one of the new applications to control the measurement device; and
   wherein the application control comprises:
      an install interface to install a new application using the graphical user interface;
      an extension interface to extend the graphical user interface to accommodate the new application;
      a launch interface to launch the new application using the extended graphical user interface; and
      a control interface to allow the new application to control the measurement device through the remote control mechanism of the measurement device.

2. The measurement device of claim 1, wherein the remote control mechanism includes a general purpose interface bus interface.

3. The measurement device of claim 1, wherein the remote control mechanism includes an RS-232 interface.

4. The measurement device of claim 1, wherein the remote control mechanism includes a universal serial bus interface.

5. The measurement device of claim 1, wherein the graphical user interface includes a menu item and dialog box for installation of new applications.

6. The measurement device of claim 1, further comprising a storage unit for loading of new applications.

7. The measurement device of claim 6, wherein the storage unit is a floppy disk drive.

8. The measurement device of claim 6, wherein the storage unit is a compact disk drive.

9. The measurement device of claim 1, wherein the text file is used to create at least one user interface entry corresponding to the graphical user interface.

10. The measurement device of claim 1, wherein the measurement device is an oscilloscope.

11. The measurement device of claim 1, wherein the installation interface includes a menu item.

12. The measurement device of claim 1, wherein installation interface includes a menu item and a dialog box.

13. The measurement device of claim 1, wherein the extension interface is configured to generate the text file.

14. The measurement device of claim 13, wherein the text file includes a data format to allow menu items to be added throughout a menu hierarchy of the measurement device.

15. The measurement device of claim 1, further comprising an operating system, wherein the launch interface is located in the operating system.

16. The measurement device of claim 1, wherein the launch interface includes data structures provided by the Microsoft Visual C++ software development environment.

17. The measurement device of claim 1, wherein the launch interface is configured to:
   reserve a block of unique command identifiers;
   create a message map entry; and
   reserve space for an array of strings.

18. The measurement device of claim 17, wherein each command identifier is a symbol with an associated numeric value.

* * * * *

UNITED STATES PATENT AND TRADEMARK OFFICE
CERTIFICATE OF CORRECTION

| | |
|---|---|
| PATENT NO. | : 7,005,846 B2 |
| APPLICATION NO. | : 10/196913 |
| DATED | : February 28, 2006 |
| INVENTOR(S) | : Fender et al. |

It is certified that error appears in the above-identified patent and that said Letters Patent is hereby corrected as shown below:

On the title page, item (56), under "U.S. Patent Documents", in column 2, line 12, after "6,648,506" delete "B1" and insert -- B2 --, therefor.

In column 12, line 1, in Claim 1, after "control" insert -- logic --.

Signed and Sealed this

Eleventh Day of July, 2006

JON W. DUDAS
*Director of the United States Patent and Trademark Office*